(12) United States Patent
Chee et al.

(10) Patent No.: US 11,985,900 B2
(45) Date of Patent: May 14, 2024

(54) DISPLACEMENT MAGNIFYING MECHANISM, POLISHING DEVICE, ACTUATOR, DISPENSER, AND AIR VALVE

(71) Applicant: Mechano Transformer Corporation, Tokyo (JP)

(72) Inventors: Sze Keat Chee, Tokyo (JP); Takeshi Yano, Tokyo (JP); Akio Yano, Tokyo (JP)

(73) Assignee: MECHANO TRANSFORMER CORPORATION, Tokyo (JP)

( * ) Notice: Subject to any disclaimer, the term of this patent is extended or adjusted under 35 U.S.C. 154(b) by 1166 days.

(21) Appl. No.: 16/735,571

(22) Filed: Jan. 6, 2020

(65) Prior Publication Data
US 2020/0144477 A1    May 7, 2020

Related U.S. Application Data

(63) Continuation of application No. PCT/JP2018/022644, filed on Jun. 13, 2018.

(30) Foreign Application Priority Data

Jul. 7, 2017    (JP) ................................. 2017-134062

(51) Int. Cl.
  *H01L 41/09*    (2006.01)
  *F16K 31/00*    (2006.01)
  (Continued)

(52) U.S. Cl.
  CPC ....... *H10N 30/2043* (2023.02); *F16K 31/004* (2013.01); *H02N 2/0075* (2013.01)

(58) Field of Classification Search
  CPC .. H10N 30/2043; H10N 30/886; H10N 30/20; H10N 30/88; F16K 31/004;
  (Continued)

(56) References Cited

U.S. PATENT DOCUMENTS

5,453,038 A * 9/1995 Baumann .................. B24B 1/00
                                                       451/28
6,157,115 A * 12/2000 Hassler, Jr. ............ H02N 2/043
                                                       310/328
(Continued)

FOREIGN PATENT DOCUMENTS

JP    2000-092876    3/2000
JP    2000092876 A    3/2000
(Continued)

OTHER PUBLICATIONS

European Search Report issued in corresponding European application No. 18828027.5 dated Mar. 1, 2021.
(Continued)

*Primary Examiner* — Donnell A Long
(74) *Attorney, Agent, or Firm* — Miles & Stockbridge, P.C.

(57) ABSTRACT

A displacement magnifying mechanism includes a base portion serving as a substrate; a first attachment portion and a second attachment portion which are provided on a surface on one side of the base portion; a first piezoelectric element and a second piezoelectric element of which one ends are attached to the first attachment portion and the second attachment portion; an operating portion which is connected to the other ends of the first piezoelectric element and the second piezoelectric element and generates a displacement due to expansion and contraction of the piezoelectric element; and a link portion which is disposed at the center between the first piezoelectric element and the second piezoelectric element, links the operating portion and the base portion, and is made of a material having a higher Young's modulus than that of the first piezoelectric element and the second piezoelectric element.

17 Claims, 17 Drawing Sheets

(51) Int. Cl.
*H02N 2/00* (2006.01)
*H10N 30/20* (2023.01)

(58) Field of Classification Search
CPC ........ H02N 2/0075; H02N 2/043; H02N 2/04; B24B 1/00; B24B 37/34
See application file for complete search history.

(56) References Cited

U.S. PATENT DOCUMENTS

| | | | |
|---|---|---|---|
| 6,437,485 | B1 | 8/2002 | Johansson |
| 6,464,202 | B1 | 10/2002 | Boecking |
| 2004/0027780 | A1 | 2/2004 | Wallis et al. |
| 2004/0206409 | A1* | 10/2004 | Yano ................ F16K 31/004 137/883 |
| 2013/0234561 | A1 | 9/2013 | Moler |
| 2013/0342075 | A1 | 12/2013 | Seddik et al. |
| 2016/0193624 | A1 | 7/2016 | Ikushima |

FOREIGN PATENT DOCUMENTS

| | | |
|---|---|---|
| JP | 2002-124048 | 4/2002 |
| JP | 2009-044861 | 2/2009 |
| JP | 2009044861 A | 2/2009 |
| JP | 2009-052985 | 3/2009 |
| JP | 2009052985 A | 3/2009 |
| JP | 2011-033033 | 2/2011 |
| JP | 2012-175746 | 9/2012 |
| JP | 2012175746 A | 9/2012 |
| JP | 2014-504135 | 2/2014 |
| JP | 2014504135 A | 2/2014 |
| JP | 2017-070133 | 4/2017 |
| JP | 2017070133 A | 4/2017 |
| KR | 10-2003-7006852 | 9/2003 |
| KR | 10-2013-7017827 | 12/2013 |
| WO | 2016209168 A1 | 12/2016 |
| WO | WO 2016/209168 | 12/2016 |

OTHER PUBLICATIONS

Office Action dated May 7, 2022 for Chinese Patent Application No. 201880045316.9.
Office Action dated May 31, 2022 for Japan Patent Application No. 2019-527604.
Examination Report dated Oct. 13, 2021 in Indian Application No. 202027001493.
Office Action dated Feb. 1, 2023 in European Application No. 18 828 027.5.
PCT International Application No. PCT/JP2018/022644 filed Jun. 13, 2018 filed in the name of Mechano Transformer Corporation, International Search Report and Written Opinion dated Sep. 18, 2018.
Korean Patent Application No. 10-2020-7001233 filed Jan. 14, 2020 in the name of Mechano Transformer Corporation, Non-final Office Action dated Aug. 31, 2021.

* cited by examiner

DISPLACEMENT MAGNIFYING MECHANISM, POLISHING DEVICE, ACTUATOR, DISPENSER, AND AIR VALVE

CROSS-REFERENCE TO RELATED APPLICATIONS

This application is a continuation PCT International Patent Application No. PCT/JP2018/022644, filed Jun. 13, 2018, which claims priority to Japanese Patent Application No. 2017-134062, filed Jul. 7, 2017, the contents of each of which is incorporated herein by reference in its entirety.

BACKGROUND OF THE INVENTION

Field of the Invention

The present invention relates to a displacement magnifying mechanism, a polishing device, an actuator, a dispenser, and an air valve.

Description of Related Art

In the related art, a piezoelectric element (piezo element) has been used as an element that is caused to generate a required displacement at a relatively low voltage. The piezoelectric element is an element which has a structure in which substances having a piezoelectric effect and thin electrodes are alternately laminated and has a function of converting a force into a voltage or converting a voltage into a force.

Since piezoelectric elements can be minutely expanded, contracted and changed by controlling a voltage, they are used in various fields such as an ink ejection mechanism of an inkjet printer and a control mechanism such as an actuator.

Piezoelectric elements expand and contract when a voltage is applied. However, since a degree of displacement that occurs is small, a displacement magnifying mechanism that magnifies a displacement of the piezoelectric element that expands and contracts and applies it to an object is used.

Patent Document 1 discloses a displacement magnifying mechanism that can magnify a displacement that occurs in a piezoelectric element and freely move an operating portion, and a polishing device using the displacement magnifying mechanism.

PATENT DOCUMENTS

[Patent Document 1] Japanese Unexamined Patent Application Publication No. 2011-033033

SUMMARY OF THE INVENTION

In the displacement magnifying mechanism described in Patent Document 1, when a piezoelectric element expands and contracts, a displacement magnified in a direction perpendicular to the expansion and contraction direction appears. However, when a force is applied in a direction perpendicular to the operating portion while being fixed to a base portion, or when there is a load that prevents the magnified displacement, a tensile force is applied to the piezoelectric element (expansion and contraction member). Generally, since the piezoelectric element easily breaks due to a tensile force, it can break due to such a force in the vertical direction or a load with which the magnified displacement is prevented.

The displacement magnifying mechanism described in Patent Document 1 is expected to be applied not only to a polishing device but also in various applications as an actuator, but its applications are limited due to a property of the piezoelectric element being weak with respect to a tensile force.

Thus, the present invention provides a displacement magnifying mechanism and a polishing device that can efficiently release a tensile force on a piezoelectric element in a displacement magnifying mechanism that generates a required displacement by applying a voltage.

In addition, the present invention provides an actuator that can magnify and output a displacement of a piezoelectric element and efficiently release a tensile force on the piezoelectric element, and a dispenser and air valve using the same.

A displacement magnifying mechanism according to the present invention includes a base portion serving as a substrate; a first attachment portion and a second attachment portion which are provided on a surface on one side of the base portion; a first piezoelectric element and a second piezoelectric element of which one ends are attached to the first attachment portion and the second attachment portion, respectively; an operating portion which is connected to the other ends of the first piezoelectric element and the second piezoelectric element and generates a displacement due to expansion and contraction of the piezoelectric elements; and a link portion which is disposed at the center between the first piezoelectric element and the second piezoelectric element, links the operating portion and the base portion, and is made of a material having a higher Young's modulus than that of the first piezoelectric element and the second piezoelectric element.

In the displacement magnifying mechanism according to the present invention, the operating portion may be disposed so that a distance from the base portion is longer than a distance between the first attachment portion and the second attachment portion.

In the displacement magnifying mechanism according to the present invention, the first piezoelectric element and the second piezoelectric element may be disposed to have a predetermined angle with respect to a direction perpendicular to a surface on which the base portion is installed.

In the displacement magnifying mechanism according to the present invention, the predetermined angle may be provided so that extension lines of axes in expansion and contraction directions of the first piezoelectric element and the second piezoelectric element intersect on a line along which a load is applied to the displacement magnifying mechanism.

In the displacement magnifying mechanism according to the present invention, the link portion may be made of a metal and integrally processed with at least one of the base portion and the operating portion.

In the displacement magnifying mechanism according to the present invention, a width of the attachment portion in contact with the base portion may be formed to be narrower than a width thereof in contact with the piezoelectric element.

A polishing device according to the present invention includes a base portion serving as a substrate; a first attachment portion and a second attachment portion which are provided on a surface on one side of the base portion; a first piezoelectric element and a second piezoelectric element of which one ends are attached to the first attachment portion and the second attachment portion; an operating portion which is connected to the other ends of the first piezoelectric element and the second piezoelectric element and generates a displacement due to expansion and contraction of the piezoelectric elements; a link portion which is disposed at the center between the first piezoelectric element and the second piezoelectric element, links the operating portion and the base portion, and is made of a material having a higher Young's modulus than that of the first piezoelectric element and the second piezoelectric element; and a polishing portion which is provided on a surface of the operating portion opposite to a surface in contact with the first piezoelectric element and the second piezoelectric element.

An actuator according to the present invention includes a base portion serving as a substrate; a first attachment portion and a second attachment portion which are attached to a surface on one side of the base portion; a first piezoelectric element and a second piezoelectric element of which one ends are connected to tip portions of the first attachment portion and the second attachment portion, respectively; an operating portion which is connected to the other ends of the first piezoelectric element and the second piezoelectric element and generates a displacement due to expansion and contraction of the piezoelectric elements; a link portion which is disposed at the center between the first piezoelectric element and the second piezoelectric element, links the operating portion and the base portion, and is made of a material having a higher Young's modulus than that of the first piezoelectric element and the second piezoelectric element; and a drive portion which supplies a voltage or a current to the first piezoelectric element and second piezoelectric element and drives the first piezoelectric element and the second piezoelectric element to expand and contract, wherein, when the drive portion supplies a voltage or a current to the first piezoelectric element and the second piezoelectric element, and the first piezoelectric element and the second piezoelectric element are displaced by expansion and contraction, a magnified displacement is output from the operating portion.

In the actuator of the present invention, the drive portion may supply a voltage or a current to the first piezoelectric element and the second piezoelectric element so that the first piezoelectric element and the second piezoelectric element are displaced in directions opposite to each other by a predetermined amount.

The actuator of the present invention may drive a working element that is used for processing an electronic component in an electronic component processing device which processes a chip-like electronic component. In addition, the electronic component processing device may be a measuring device for measuring characteristics of an electronic component, and the working element may be a measuring probe which is brought into contact with the electronic component and measures characteristics. The electronic component processing device may be a measuring device for measuring characteristics of an electronic component, and the working element may be a suction nozzle for sucking the electronic component and the electronic component sucked into the suction nozzle may be brought into contact with a measuring probe for measuring characteristics.

A dispenser according to the present invention includes a liquid discharging member into which a liquid is introduced and from which the introduced liquid is discharged; a valve that allows discharge of a liquid from the liquid discharging member or blocks this; and the actuator having the above configuration that drives the valve, wherein the valve is displaced due to the displacement output from the actuator and allows discharge of a liquid from the liquid discharging member and blocks this.

An air valve according to the present invention includes a valve main body including a compressed air chamber into which compressed air is introduced and an air outlet that opens to the outside from the compressed air chamber; a valve body that operates to close and open the air outlet in the compressed air chamber; and the actuator having the above configuration that is provided in the compressed air chamber and drives the valve body, wherein the valve body is displaced due to the displacement output from the actuator and allows discharge of air from the air outlet and blocks this.

The displacement magnifying mechanism and the polishing device according to the present invention include a link portion having high rigidity that applies a pressurizing force with respect to a tensile force applied to the piezoelectric element, and thus can efficiently release the tensile force.

DETAILED DESCRIPTION OF THE INVENTION

Embodiments of the present invention will be described below with reference to the appended drawings.

<Displacement Magnifying Mechanism>

First Embodiment

First, a displacement magnifying mechanism according to a first embodiment will be described.

(Configuration of Displacement Magnifying Mechanism According to First Embodiment)

Figure 1:
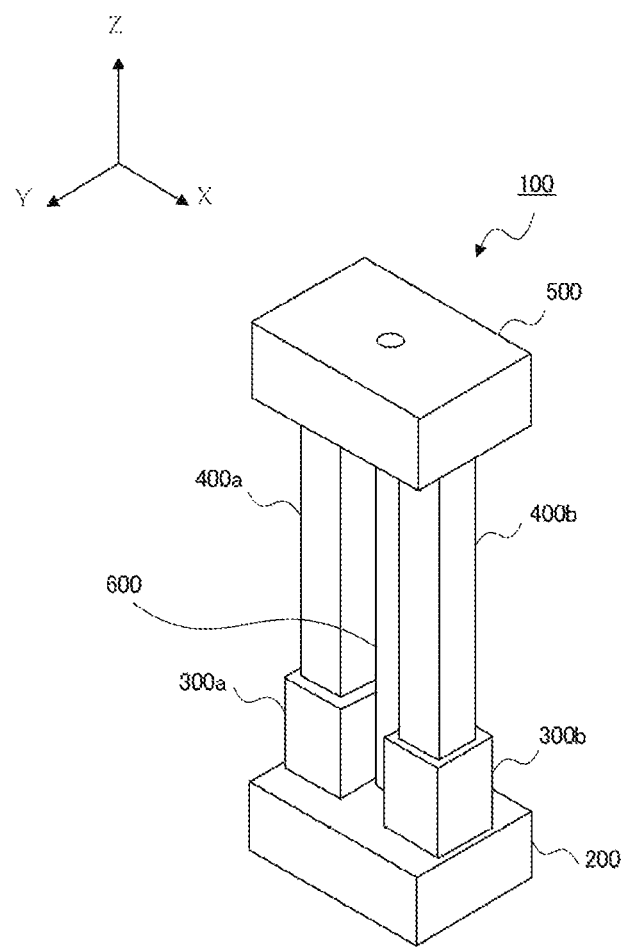
FIG. 1 is a perspective view showing an example of a configuration of a displacement magnifying mechanism 100 according to a first embodiment.

FIG. 1 is a perspective view for explaining an example of a configuration of a displacement magnifying mechanism 100 according to the first embodiment of the present invention.

The displacement magnifying mechanism 100 is a mechanism of a piezoelectric element that magnifies a displacement of a piezoelectric element that expands and contracts according to an application voltage and applies it to an object. As shown in FIG. 1, the displacement magnifying mechanism 100 includes a base portion 200 serving as a substrate of the displacement magnifying mechanism 100, a first attachment portion 300a and a second attachment portion 300b attached to a surface (upper surface) on one side of the base portion 200, a first piezoelectric element 400a and a second piezoelectric element 400b of which one ends are connected to tip portions (upper end portions) of the first attachment portion 300a and the second attachment portion 300b, respectively, an operating portion 500 which is connected to the other ends of the first piezoelectric element 400a and the second piezoelectric element 400b, and generates a displacement due to expansion and contraction of the first piezoelectric element 400a and the second piezoelectric element 400b, and a link portion 600 which is disposed substantially at the center between the first piezoelectric element 400a and the second piezoelectric element 400b, links the operating portion 500 and the base portion 200, and is made of a material having a higher Young's modulus than that of the piezoelectric elements 400a and 400b. Here, the first attachment portion 300a and the second attachment portion 300b may be integrated with the base portion 200 or may be simply provided as ports on the surface of one side of the base portion 200.

If there is no need to particularly distinguish the first attachment portion 300a and the second attachment portion 300b, they will be collectively referred to as the attachment portion 300. In addition, if there is no need to particularly distinguish the first piezoelectric element 400a and the second piezoelectric element 400b, they will be collectively referred to as the piezoelectric element 400.

The base portion 200 is a member serving as a substrate of the displacement magnifying mechanism 100. The base portion 200 may have any shape or material as long as the piezoelectric element 400 can be attached and fixed to the attachment portion 300. Specifically, as shown in FIG. 1, the base portion 200 can have a rectangular shape. In addition, regarding the material, it is conceivable to use a metal or the like.

In addition, the base portion 200 may be integrally processed with at least one of the attachment portion 300, the operating portion 500 and the link portion 600. In such a configuration, since processing is easy to and there is no need to provide a bonding portion, it is possible to cope with vulnerabilities resulting, for example, a component becoming detached from the bonding portion and breaking.

Figure 2:
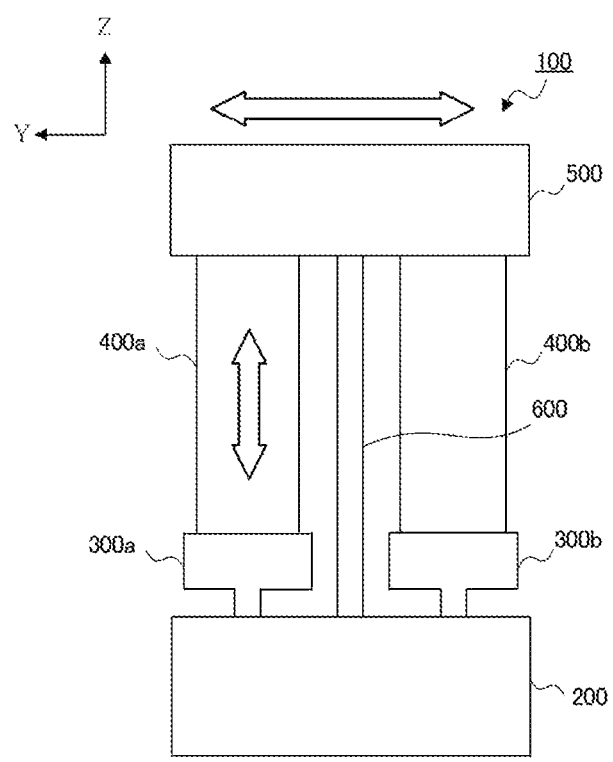
FIG. 2 is a front view showing an example of a configuration of the displacement magnifying mechanism 100 according to the first embodiment.

The attachment portion 300 is a member attached to the upper portion of the base portion 200. The attachment portion 300 is used to link the piezoelectric element 400 to the base portion 200. As shown in FIG. 1, the attachment portion 300 may be formed in a rectangular shape and linked to fix the piezoelectric element 400. As shown in FIG. 2, the width of the attachment portion 300 in contact with the base portion is formed to be narrower than the width thereof in contact with the piezoelectric element (for example, an L-shape and a T-shape, and FIG. 2 shows an example formed in a T-shape) and a hinge mechanism is provided, and linking may be performed with a degree of freedom. The former is preferable because then a force due to a piezoelectric effect is easily reliably transmitted to the operating portion 500. On the other hand, the latter is preferable because then stroke of the operating portion 500 in the Y direction shown in FIG. 2 tends to appear. In addition, the attachment portion 300 may be integrally molded with the base portion 200, the base portion 200 and the link portion 600, or the base portion 200, the link portion 600 and the operating portion 500.

The piezoelectric element 400 is a member that expands and contracts according to an application voltage. As shown in FIG. 1, the piezoelectric element 400 is disposed above the attachment portion 300. For example, as shown in FIG. 1, the piezoelectric element 400 can be formed in a rectangular shape. Regarding a main material constituting the piezoelectric element 400, a piezoelectric component as a substance having a piezoelectric effect, for example, PZT (lead zirconate titanate), can be used. The piezoelectric element 400 may have a laminated structure in which thin electrodes and thin piezoelectric components are alternately laminated. With such a laminated structure, a large displacement can be realized even at a low voltage. Here, the piezoelectric element 400 formed in a rectangular shape is exemplified in this example, but is not particularly limited to the rectangular shape, and may have any shape as long as a displacement is efficiently applied to the operating portion 500 according to a piezoelectric effect.

Specifically, as shown in FIG. 1, the piezoelectric element 400 may be formed in an elongated rectangular shape and may be disposed upright so that the longitudinal direction is in the same direction as a direction perpendicular to the upper portion of the base portion 200 formed in a rectangular shape. In such a configuration, it is possible to magnify the displacement more efficiently.

Figure 6:
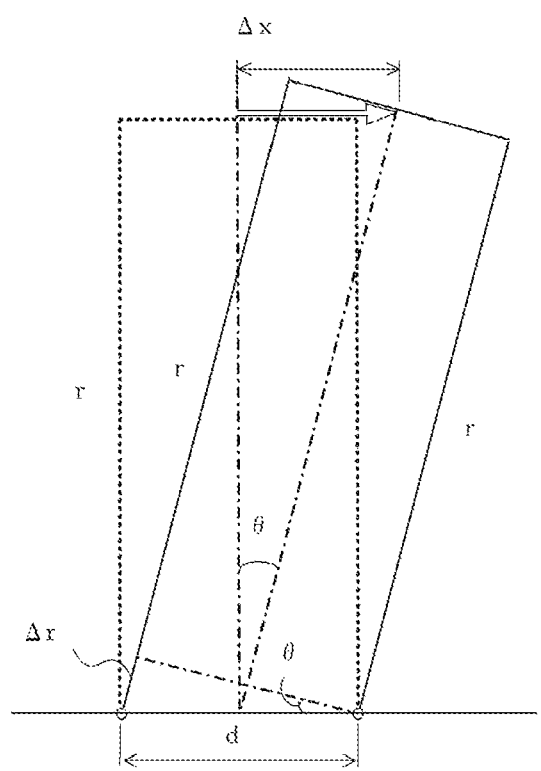
FIG. 6 is an explanatory diagram schematically showing an example of a configuration of the displacement magnifying mechanism 100 according to one embodiment.

Here, a configuration of the displacement magnifying mechanism 100 according to one embodiment of the present invention will be described with reference to FIG. 6. FIG. 6 is an explanatory diagram showing an example of a configuration of the displacement magnifying mechanism 100 according to one embodiment.

In the displacement magnifying mechanism 100 according to one embodiment of the present invention, the length from the first attachment portion 300a and the second attachment portion 300b to the operating portion 500 is set as r, and the interval between the first attachment portion 300a and the second attachment portion 300b is set as d. When the first piezoelectric element 400a expands relative to the second piezoelectric element 400b by $\Delta r$, the displacement magnifying mechanism 100 tilts by an angle $\theta$, and a displacement of $\Delta x$ occurs in the operating portion 500.

In this case, as shown in FIG. 6, Δx and Δr are represented by the following Formulae (1) and (2).

$$\Delta x \approx r\theta \quad (1)$$

$$\Delta r \approx d\theta \quad (2)$$

According to the above Formulae (1) and (2), the following Formula (3) can be obtained.

$$\Delta x \approx r/d \cdot \Delta r \quad (3)$$

As a method for effectively realizing the piezoelectric element 400a expanding relative to the piezoelectric element 400b by Δr in this manner, for example, the first piezoelectric element 400a may be caused to generate an expansion displacement and the second piezoelectric element 400b may be caused to generate a contraction displacement. Piezoelectric elements are generally used to generate "expansion" displacement in many cases, but it is not common to directly generate "contraction" displacement. However, an intermediate voltage of about ½ of the maximum application voltage is constantly applied to the first piezoelectric element 400a and the second piezoelectric element 400b, a voltage higher than the intermediate voltage is applied to the piezoelectric element 400a, and a voltage lower than the intermediate voltage is applied to the piezoelectric element 400b, and thus such a relative displacement can substantially occur.

Here, in order to configure the displacement magnifying mechanism 100, a displacement amount of the operating portion 500 needs to be larger than a displacement amount of the piezoelectric element 400, and specifically, Δx>Δr should be satisfied. That is, according to the above Formula (3), r/d>1 needs to be satisfied. In addition, when the value of r/d is larger, the magnification of the displacement magnifying mechanism 100 is larger. Thus, the piezoelectric element 400 is formed in an elongated rectangular shape, the length of r is longer, and disposition is performed so that an interval between the attachment portions 300 is reduced, and thus it is possible to provide the displacement magnifying mechanism 100 that magnifies displacement more efficiently.

The operating portion 500 is a member which is disposed above the piezoelectric element 400 and generates a displacement due to expansion and contraction of a piezoelectric element. The operating portion 500 is a member for operating on an object and may be used by selecting a shape and a material according to the object.

In addition, as an example, the operating portion 500 may be disposed so that a distance from the upper portion of the base portion 200 formed in a rectangular shape is longer than a distance between two attachment portions 300a and 300b. In such a configuration, it is possible to increase the value of r/d, and it is possible to provide the displacement magnifying mechanism 100 that efficiently magnifies a displacement.

The link portion 600 is a member which is disposed substantially at the center between two piezoelectric elements 400a and 400b, links the operating portion 500 and the base portion 200, and is made of a material having a higher Young's modulus than that of the piezoelectric element 400. When the link portion 600 that links the operating portion 500 and the base portion 200 is provided, a pressurizing force is applied to the piezoelectric element 400 by the link portion 600, and a tensile force applied to the piezoelectric element 400 when a displacement magnified in the Y direction as shown in FIG. 2 appears can be released.

Here, the principle of releasing the tensile force is as follows. In the basic structure shown in FIG. 1, when there is a force applied to the operating portion 500 or a load that prevents the magnified displacement, application of a pulling force to either the piezoelectric element 400a or the piezoelectric element 400b is basically unavoidable. However, if a compressive force stronger than a tensile force that is applied in advance is applied to the piezoelectric element 400a and the piezoelectric element 400b, the resultant force applied to the piezoelectric element 400a and the piezoelectric element 400b remains in a compressive force range. In this specification, this compressive force is called a pressurizing force. Of course, when a pressurizing force is applied, the value of the compressive force in the piezoelectric element is increased by the amount of the pressurizing force. However, generally, the material constituting a piezoelectric element is weak with respect to the pulling force, but there is a sufficient margin with respect to the compressive force, and thus application of the pressurizing force does not promote breakage of the piezoelectric element.

In addition, in such a configuration, the link portion 600 contributes to application of the pressurizing force but has less influence on a displacement magnifying operation. In particular, when an expansion displacement is applied to one piezoelectric element 400 and a contraction displacement is applied to the other piezoelectric element, the change in the length of the link portion 600 is canceled out. Therefore, only the force related to bending deformation of the link portion 600 becomes a load on the displacement magnifying operation and the influence on the displacement magnifying operation is reduced. In such a configuration, it is possible to efficiently release the tensile force applied to the piezoelectric element 400, and it is possible to efficiently prevent breakage, separation of a connection portion, and the like due to the force in the Y direction applied to the piezoelectric element 400.

In addition, the link portion 600 in FIG. 2 may be integrally processed with at least one of the base portion 200 and the operating portion 500. The link portion 600 may be integrally processed with the attachment portion 300 via the base portion 200 or the operating portion. In such a configuration, since there is no need to provide a bonding portion, it is possible to cope with vulnerabilities resulting, for example, a component becoming detached from the bonding portion.

In addition, as another example, the link portion 600 may be bonded by soldering or welding in bonding with at least one of the base portion 200 and the operating portion 500.

In addition, in order to apply a required pressurizing force to the piezoelectric element 400, the link portion 600 needs to be made of a material that can withstand a tensile force corresponding to the pressurizing force. In that sense, the member must not be a brittle material and needs to be made of a material having a higher Young's modulus than that of the piezoelectric element. As described above, when the first piezoelectric element 400a is caused to generate an expansion displacement and the second piezoelectric element 400b is caused to generate a contraction displacement, the link portion 600 does not need to expand and contract as a whole and thus energy is not consumed, and it is possible to efficiently apply a pressurizing force to the first and second piezoelectric elements 400a and 400b. Here, the material of the link portion 600 may be specifically a metal.

(Operation of Displacement Magnifying Mechanism According to First Embodiment)

An example of the operation of the displacement magnifying mechanism 100 according to the first embodiment of the present invention will be described with reference to FIG. 2. FIG. 2 is a front view showing an example of a configuration of the first embodiment of the displacement magnifying mechanism 100 according to the first embodiment of the present invention.

As shown in FIG. 2, in the displacement magnifying mechanism 100, when a voltage or a current is supplied to the piezoelectric element 400a connected to the base portion 200 via the attachment portion 300, and expansion and contraction occur, the entire part is tilted according to the expansion and contraction, and a displacement in the Y direction is caused in the operating portion 500. In addition, in the displacement magnifying mechanism 100, if both the piezoelectric elements 400a and 400b are expanded and contracted in the same phase, a displacement in the Z direction can be caused in the operating portion 500.

(Method of Applying Pressurizing Force in First Displacement Magnifying Mechanism)

Figure 3:
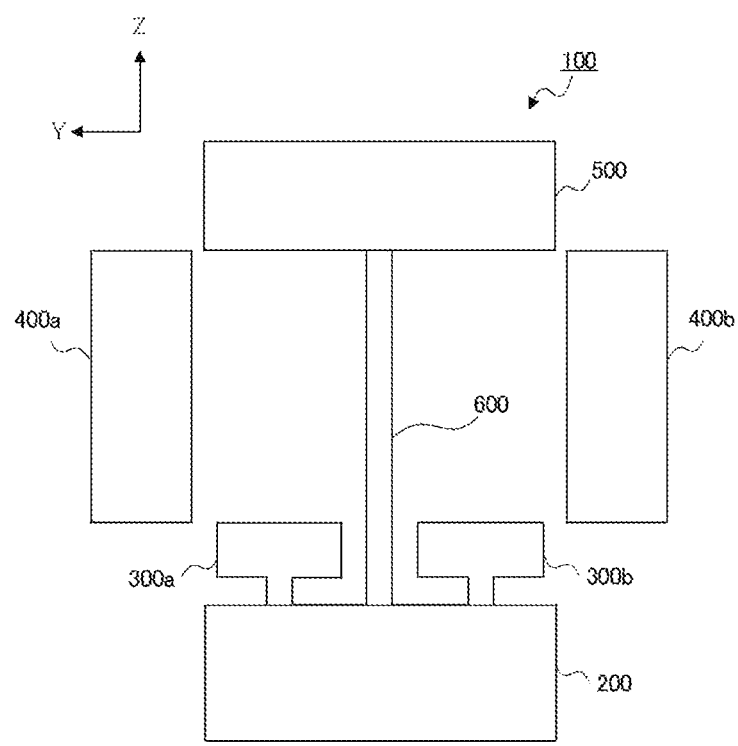
FIG. 3 is a front view showing an example of a configuration of the displacement magnifying mechanism 100 according to the first embodiment.

An example of a method of applying a pressurizing force to the piezoelectric element 400 in the displacement magnifying mechanism 100 according to the first embodiment of the present invention will be described with reference to FIG. 3. FIG. 3 is a front view for explaining a state in which a pressurizing force is applied to the displacement magnifying mechanism 100 according to the first embodiment of the present invention.

In the displacement magnifying mechanism 100, a distance between gaps for inserting and attaching the piezoelectric element 400 (between an upper portion of the attachment portion 300 and a lower portion of the operating portion 500) may be set to be smaller than a size of the piezoelectric element 400 in the expansion and contraction direction. In other words, the size of the link portion 600 in the linking direction may be set to be shorter than a sum of the size of the piezoelectric element 400 in the expansion and contraction direction and the size of the attachment portion 300 in the attachment direction. In this case, when the piezoelectric element 400 is attached, it is attached in a state in which it is contracted to some extent when assembling is completed. When respective sizes are set in this manner, it is possible to simply apply a pressurizing force to the piezoelectric element 400 while respective parts are assembled.

That is, as shown in FIG. 3, in the displacement magnifying mechanism 100, when the piezoelectric element 400 is attached, if a tensile force is applied between the lower attachment portion 300 and the upper operating portion 500 to extend the link portion 600, a distance between gaps for inserting and attaching the piezoelectric element 400 is made larger than the size of the piezoelectric element 400 in the expansion and contraction direction and the tensile force is released after the piezoelectric element 400 is inserted. In this manner, it is possible to simply apply a pressurizing force to the piezoelectric element 400.

Second Embodiment

Next, a displacement magnifying mechanism according to a second embodiment will be described.

(Configuration of Displacement Magnifying Mechanism According to Second Embodiment)

Figure 4:
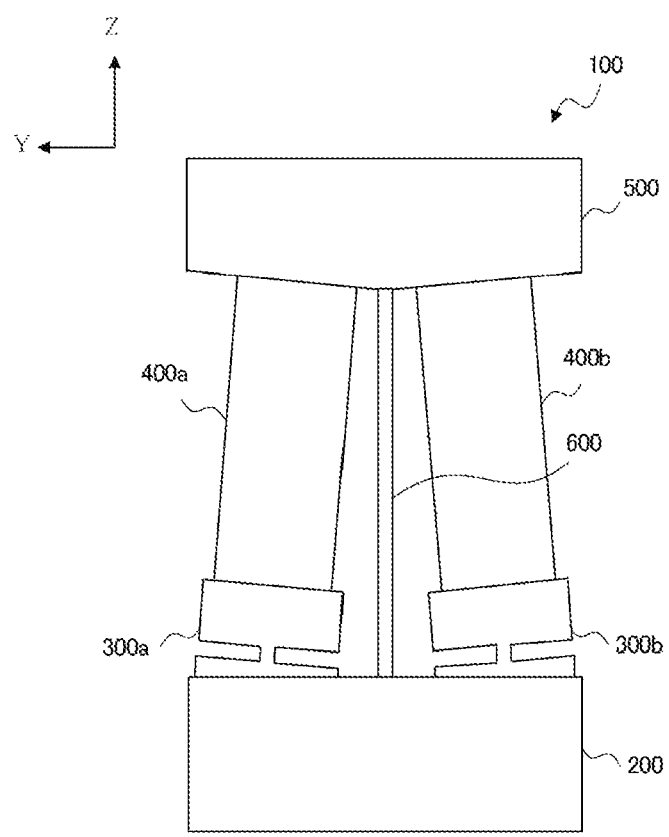
FIG. 4 is a front view showing an example of a configuration of a displacement magnifying mechanism 100 according to a second embodiment.

FIG. 4 is a front view showing an example of a configuration of the displacement magnifying mechanism 100 according to the second embodiment of the present invention.

As shown in FIG. 4, in the displacement magnifying mechanism 100 according to the second embodiment of the present invention, the difference from the configuration of the first embodiment is that the first piezoelectric element 400a and the second piezoelectric element 400b are disposed to have predetermined angles (have angles) with respect to a direction perpendicular to the upper portion (upper surface) of the base portion 200. Even if they are configured to have respective angles, there is no substantial influence on the displacement magnifying operation. The difference is a value of the force generated. It is assumed that the first piezoelectric element 400a and the second piezoelectric element 400b are caused to generate different displacements, and a magnified displacement occurs in the operating portion 500. In this case, it is assumed that a force is applied in a direction in which the displacement that occurs in the operating portion 500 is canceled out, a value of the force that causes the position of the operating portion 500 to return to the original position is set as a generated force F. When the generated displacement of the operating portion 500 is set as, and the rigidity viewed from the operating portion is set as K, the relationship between the generated displacement, the generated force, and the rigidity is represented by the following Formula (4).

$$F = \xi \times K \tag{4}$$

When the piezoelectric elements 400 are configured to have respective angles, the value of K increases. For example, in the configuration in FIG. 5, when the piezoelectric element 400 has a cross-sectional size of 5 mm×5 mm and a length of 10 mm, and the piezoelectric element 400 has a generated displacement of 10 μm, the differences between generated forces when the relative angle (a predetermined angle of the piezoelectric element 400 with respect to a direction perpendicular to the upper portion of the base portion 200) of the piezoelectric element 400 is 0° and 10° are shown in Table 1. The case with a piezoelectric element relative angle of 10° in both the generated displacement and the generated force in the operating portion 500 is excellent.

TABLE 1

| Piezoelectric element relative angle (°) | Generated displacement (μm) | Generated force (N) |
| --- | --- | --- |
| 0 | 110.9 | 81.0 |
| 10 | 113.1 | 87.8 |

The reason why the generated force is improved in such a configuration is speculated that, if the piezoelectric elements 400 are disposed obliquely, if an external force is applied, the external force is applied to the piezoelectric element as a force on the axis of the piezoelectric element, and thus it is possible to significantly reduce bending deformation in the piezoelectric element.

Here, the operation of the displacement magnifying mechanism 100 according to the second embodiment of the present invention and a method of applying a pressurizing force are the same as those in the first embodiment.

Modified Example of Second Embodiment

Figure 5:
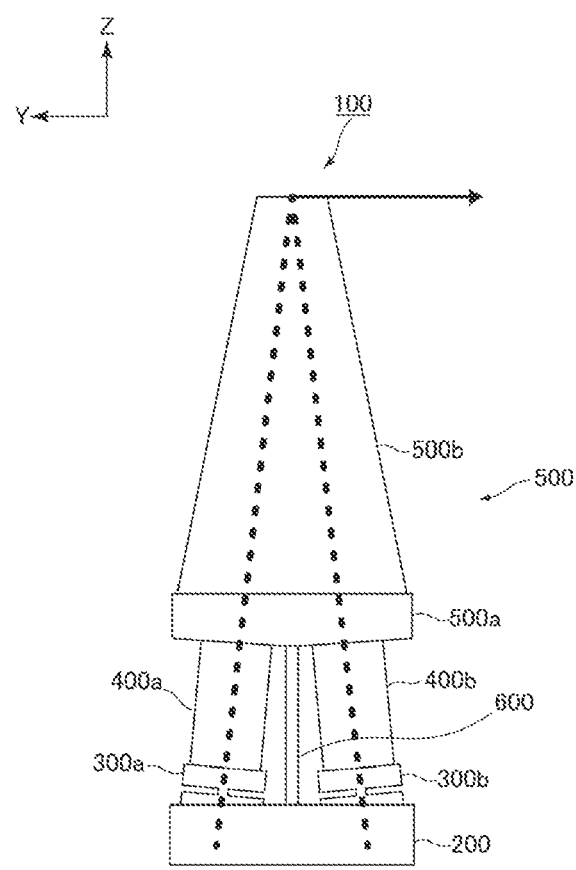
FIG. 5 is a front view showing an example of a configuration of the displacement magnifying mechanism 100 according to the second embodiment.

A modified example of the configuration of the displacement magnifying mechanism 100 according to the second embodiment of the present invention will be described with reference to FIG. 5. FIG. 5 is a front view showing an example of a configuration of the displacement magnifying mechanism 100 according to a modified example of the second embodiment of the present invention.

As shown in FIG. 5, in the displacement magnifying mechanism 100 according to a modified example of the second embodiment of the present invention, the operating portion 500 includes the first operating portion 500a to which the piezoelectric element 400 is connected and the second operating portion 500b connected to the first operating portion 500a. The second operating portion is a member that outputs a magnified displacement and transmits a force to an object and has a shape that becomes narrower toward the tip. The second operating portion 500b may be made of any material as long as it is rigid enough to operate on an object. For example, aluminum can be used in order to reduce the weight. The first operating portion 500a and the second operating portion 500b may be integrally provided.

In the upper portion of the second operating portion 500b, when a load is applied to in the direction (the direction (Y direction) perpendicular to a surface on which the base portion is installed) of an arrow, a predetermined angle is provided so that extension lines of axes in the expansion and contraction directions intersect on the extension line of a vector of the load. When the piezoelectric element 400 is disposed so that such an angle is provided, the force applied to the piezoelectric element 400 mainly includes a compressive force and a tensile force of the piezoelectric element 400, and the bending force is significantly small. Regarding the force in the pulling direction, as in the first embodiment, when a compressive force that overcomes the tensile force is applied to the piezoelectric element 400 in advance as a pressurizing force, since the tensile force is not applied to the piezoelectric element 400 comprehensively, it is possible to release the tensile force more efficiently.

<Polishing Device>

Next, a polishing device using the displacement magnifying mechanism according to the first embodiment will be described.

[Configuration of Polishing Device]

Figure 7:
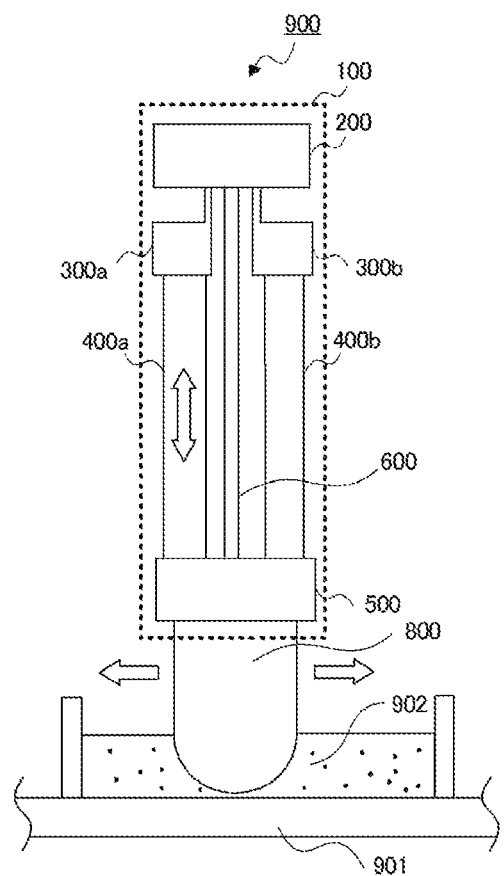
FIG. 7 is a front view showing an example of a configuration of a polishing device 900 according to an embodiment.

FIG. 7 is a front view showing an example of a configuration of a polishing device 900 using the displacement magnifying mechanism according to the first embodiment of the present invention. The polishing device 900 includes the displacement magnifying mechanism 100 and a polishing portion 800 provided on a surface of the operating portion 500 opposite to a surface in contact with the piezoelectric element 400.

The polishing device 900 is attached to the operating portion 500 of the displacement magnifying mechanism 100, and the polishing portion 800 as a polishing tool has a tip that is in contact with a polishing subject 901 or is in contact with the polishing subject 901 with free abrasive grains 902 interposed therebetween. In a polishing method exemplified here, the free abrasive grains 902 mixed with a liquid at a polishing position are provided, and the polishing portion 800 slides on the surface of the polishing subject 901 by expansion and contraction of the piezoelectric element 400, and the polishing subject 901 is polished. However, a polishing method in which those in which direct diamond abrasives and the like are fixed to the polishing portion 800 are polished is also conceivable.

Unlike the example shown in FIG. 7, even if the polishing device 900 has a configuration in which the polishing subject 901 is attached to the operating portion 500 and the polishing portion 800 is fixed, since the relative movement between the polishing portion 800 and the polishing subject 901 does not change, the same polishing can be performed.

In the polishing device 900, in such a configuration, it is possible to efficiently release a tensile force applied to the piezoelectric element 400, and it is possible to provide a polishing device that can efficiently prevent breakage, separation of a connection portion, and the like due to the force in the Y direction applied to the piezoelectric element 400.

In addition, in the polishing device 900, since a conventional displacement magnifying mechanism is provided for each piezoelectric element, when the displacement magnifying mechanism is provided in the polishing device and the like, there are problems of displacement magnifying mechanisms colliding with each other and the entire polishing device becoming large. However, as shown in the example, since the displacement magnifying mechanism of the present invention constitutes one displacement magnifying mechanism as a whole using all the piezoelectric elements, the structure of the polishing device can be made simple and compact.

<Actuator>

Next, an example in which the displacement magnifying mechanism of the present invention is used as an actuator will be described.

Figure 8:
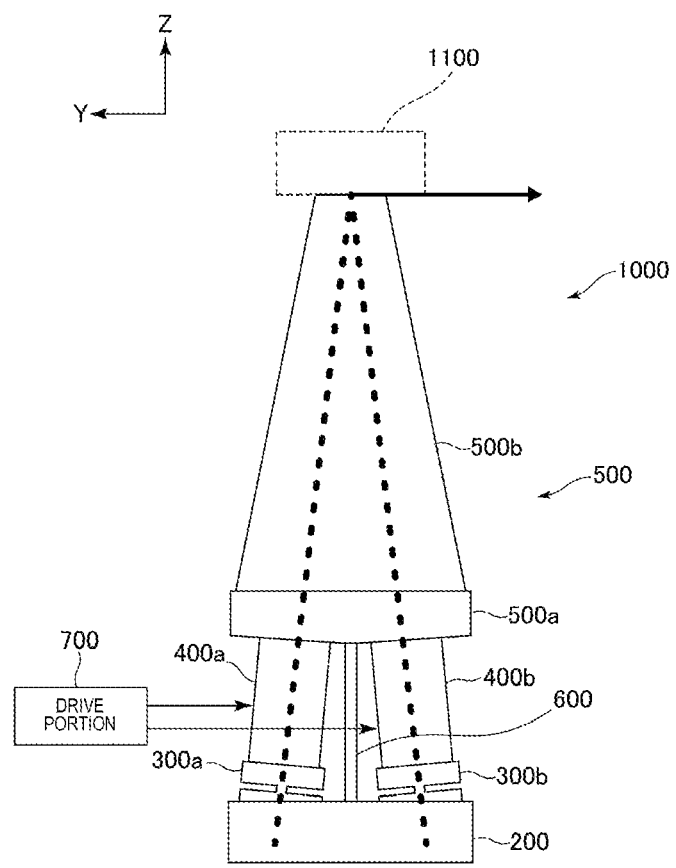
FIG. 8 is a front view showing an example of an actuator using a displacement magnifying mechanism according to a modified example of the second embodiment.

FIG. 8 is a front view showing an example of an actuator using a displacement magnifying mechanism according to a modified example of the second embodiment. The basic configuration of an actuator 1000 is the same as that of the displacement magnifying mechanism 100 according to the modified example of the second embodiment.

The actuator 1000 includes the base portion 200 as a substrate, the first attachment portion 300a and the second attachment portion 300b which are provided on the surface on one side of the base portion, the first piezoelectric element 400a and the second piezoelectric element 400b of which one ends are connected to the first attachment portion 300a and the second attachment portion 300b, the operating portion 500 which is connected to the other ends of the first piezoelectric element 400a and the second piezoelectric element 400b and generates a displacement due to expansion and contraction of the piezoelectric element, the link portion 600 which is disposed substantially at the center between the first piezoelectric element 400a and the second piezoelectric element 400b, links the operating portion 500 and the base portion 200, and is made of a material having a higher Young's modulus than that of the first piezoelectric element 400a and the second piezoelectric element 400b, and a drive portion 700 which supplies a voltage or a current to the first piezoelectric element 400a and the second piezoelectric element 400b and drives the first piezoelectric element 400a and the second piezoelectric element 400b to expand and contract. The first piezoelectric element 400a and the second piezoelectric element 400b are obliquely disposed as in the displacement magnifying mechanism in FIG. 5. Then, the drive portion 700 supplies a voltage or a current to the first piezoelectric element 400a and the second piezoelectric element 400b, the first piezoelectric element 400a and the second piezoelectric element 400b are displaced by expansion and contraction, and thus the magnified displacement is output from the operating portion 500.

The operating portion 500 includes the first operating portion 500a to which the piezoelectric element 400 is connected and the second operating portion 500b connected to the first operating portion 500a. The second operating portion 500b is a member that outputs a magnified displacement and transmits a force to an object and has a shape that becomes narrower toward the tip. The second operating portion 500b may be made of any material as long as it is rigid enough to operate on an object. For example, aluminum can be used in order to reduce the weight. The first operating portion 500a and the second operating portion

500*b* may be integrally provided. When an object 1100 is attached to the second operating portion 500*b*, a magnified displacement in the Y direction can occur in the object 1100. Specifically, when a voltage is applied to only the first piezoelectric element 400*a*, the object 1100 can be displaced to the right, and when a voltage is applied to only the second piezoelectric element 400*b*, the object 1100 can be displaced to the left.

In such an actuator 1000, since a pressurizing force can be applied to the first piezoelectric element 400*a* and the second piezoelectric element 400*b* by the link portion 600, it is possible to effectively release a tensile force applied to the first piezoelectric element 400*a* and the second piezoelectric element 400*b*.

In addition, in such a configuration, the link portion 600 contributes to application of the pressurizing force but has less influence on a displacement magnifying operation. In particular, when the drive portion 700 performs driving such that the first piezoelectric element 400*a* is caused to generate an expansion displacement and the second piezoelectric element 400*b* is caused to generate a contraction displacement (or the opposite case), the change in the length of the link portion 600 is canceled out. Therefore, only the force related to bending deformation of the link portion 600 becomes a load on the displacement magnifying operation and the influence on the displacement magnifying operation is reduced. Here, an operation of restoring the expansion and contraction displacement includes returning to the original length after the piezoelectric element expands.

Incidentally, if an actuator including a piezoelectric element operates, when the temperature of the surroundings changes or when the piezoelectric element is driven at a high frequency and thus the temperature is raised due to self-heating from the piezoelectric element itself, since the length of the piezoelectric element changes due to thermal expansion, in an actuator having a conventional piezoelectric element, the initial position of the operating portion changes due to the change in the length of the piezoelectric element. On the other hand, as described above, when one of the first piezoelectric element 400*a* and the second piezoelectric element 400*b* is caused to generate an expansion displacement and the other thereof is caused to generate a contraction displacement, such a change in the initial position can be removed.

In addition, in the piezoelectric element, a phenomenon called creep in which an amount of expansion is not stable but changes with the passage of time after a step-like voltage, a constant voltage or the like is applied occurs. The creep rate decreases logarithmically with respect to time. The creep phenomenon can be corrected by the closed loop control, but cannot be corrected by the open loop control. However, when the first piezoelectric element 400*a* and the second piezoelectric element 400*b* are displaced in directions opposite to each other by a predetermined amount, the change in the length due to creep is canceled out, and a positional displacement due to the creep phenomenon can be reduced. Therefore, there is no need to perform the closed loop control with complicated control.

In addition, since such an actuator 1000 has a simple main body portion composed of only the base portion 200, the first and second attachment portions 300*a* and 300*b*, the first and second piezoelectric elements 400*a* and 400*b*, the operating portion 500, and the link portion 600, it is suitable for high speed driving.

Here, the actuator is not limited to the example in FIG. 8, the actuator may have the same basic configuration of the displacement magnifying mechanism of the first embodiment or the displacement magnifying mechanism of the second embodiment.

[Example in which Actuator is Used to Drive Working Element Used for Processing Electronic Component]

Figure 9:
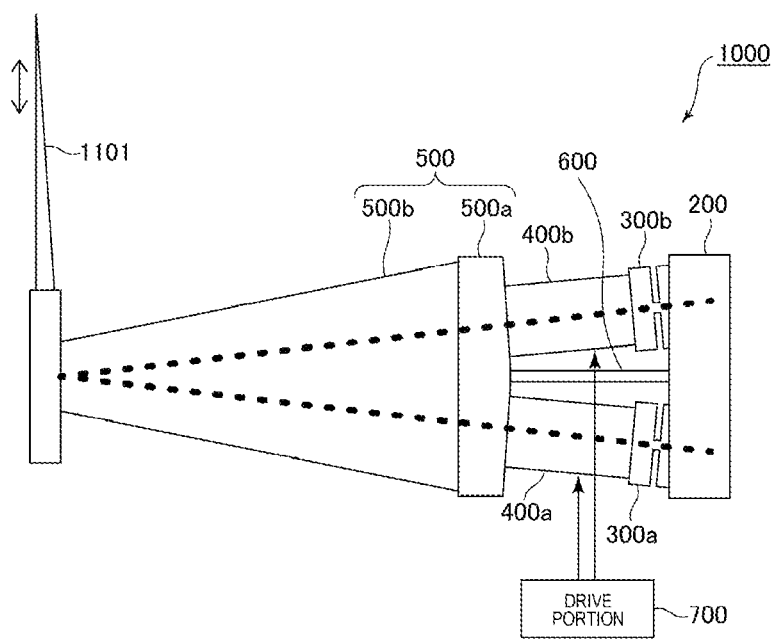
FIG. 9 is a front view showing an example in which the actuator in FIG. 8 is used to drive a measuring probe which is a working element used for processing an electronic component.

FIG. 9 is a front view showing an example in which the actuator in FIG. 8 is used to drive a working element used for processing an electronic component. A measuring probe 1101 which is a working element is attached as an object to the tip portion of the operating portion 500 (the second operating portion 500*b*) of the actuator 1000.

The drive portion 700 repeatedly supplies a voltage or a current at a high speed to the first piezoelectric element 400*a* and the second piezoelectric element 400*b* so that the first piezoelectric element 400*a* and the second piezoelectric element 400*b* are displaced in directions opposite to each other by a predetermined amount. Accordingly, the magnified displacement is transmitted to the measuring probe 1101, and the measuring probe 1101 can be moved up and down at a high speed.

Figure 10:
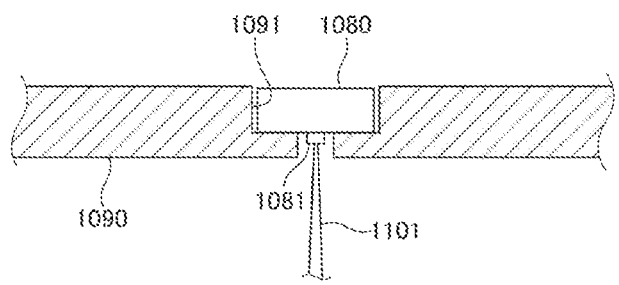
FIG. 10 is a diagram showing a state in which electrical characteristics of an electronic component are measured by a measuring probe.

FIG. 10 is a diagram showing a state in which electrical characteristics of an electronic component are measured by the measuring probe 1101.

As shown in FIG. 10, a turntable 1090 of the measuring device is rotatably provided, and has a plurality of storage grooves 1091 in which an electronic component 1080 is stored in the circumferential direction. Then, when the measuring probe 1101 as a working element is repeatedly displaced (moved up and down) at a high speed by a drive device 1 while rotating the turntable 1090, electrical characteristics and the like of the electronic component 1080 stored in the plurality of storage grooves 1091 are sequentially measured. That is, when the turntable 1090 is rotated and the electronic component 1080 stored in the storage groove 1091 reaches a measurement position directly above the measuring probe 1101, the measuring probe 1101 is displaced upward, the tip of the measuring probe 1101 is brought into contact with an electrode 1081 provided on the lower surface of the electronic component 1080, electrical characteristics of the electronic component 1080 are measured, and after the measurement, the measuring probe 1101 is displaced downward and retracted. Then, when the next electronic component 1080 reaches the measurement position, the same operation is performed again, and these operations are repeated at a high speed.

In this manner, when the actuator 1000 is used for measurement of an electronic component, the measuring probe which is a working element can be driven at a high speed with a practical stroke. In addition, it is possible to reduce breakage due to tension of the piezoelectric element and the thermal expansion and the influence of creep.

While an example in which the measuring probe 1101 of the measuring device is used as a working element has been exemplified above, the working element is not limited to the measuring probe.

Figure 11:
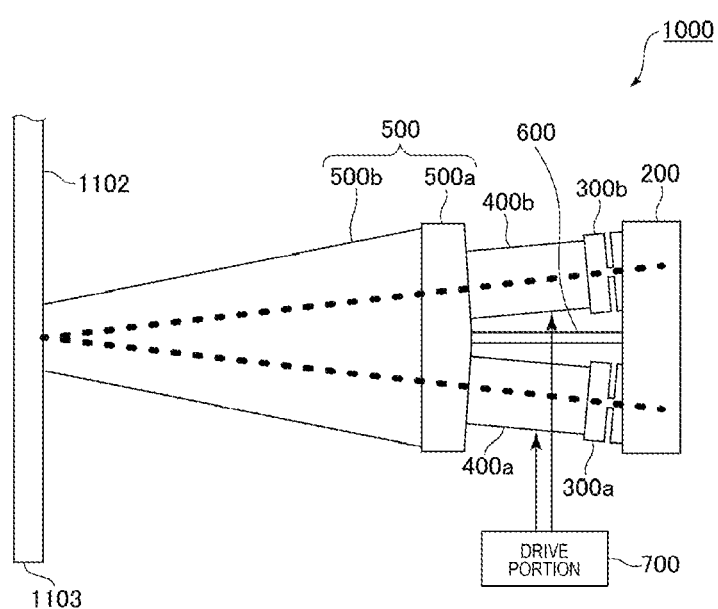
FIG. 11 is a front view showing another example in which the actuator in FIG. 8 is used to drive a suction nozzle which is a working element used for processing an electronic component.

FIG. 11 is a diagram showing a state in which an actuator using a suction nozzle 1102 as a working element is used in an electronic component processing device, and shows a case in which the driven working element is a suction nozzle that sucks an electronic component. This example is the same as the example in FIG. 9 except that the working element attached to the operating portion 500 of the actuator 1000 is replaced with the suction nozzle 1102.

The suction nozzle 1102 is mounted on the operating portion 500 (the second operating portion 500*b*) that extends in the vertical direction. A suction mechanism (not shown) is provided at the upper end portion of the suction nozzle 1102. Then, an electronic component is sucked to a suction end 1103 at the lower end of the suction nozzle 1102 by drawing of a drawing mechanism such as a vacuum pump provided in the suction mechanism.

Figure 12:
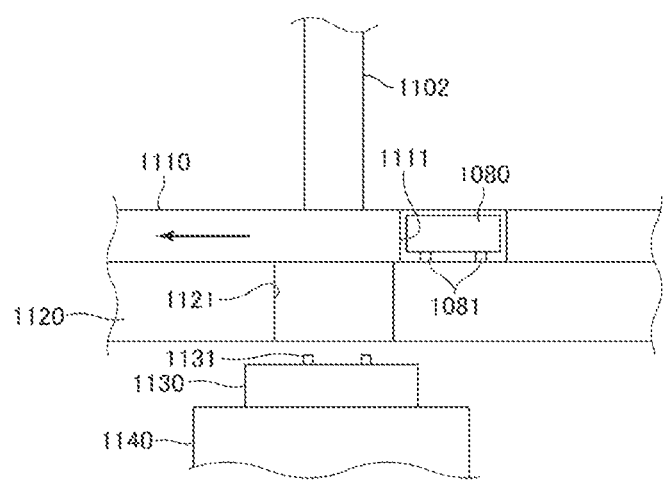
FIG. 12 is a diagram showing an example of a measuring device for measuring an electronic component using an actuator having a suction nozzle mounted thereon.

In this example, the actuator 1000 can also be used in a measuring device for performing measurement of an electronic component. FIG. 12 shows an example of the measuring device in this case. The measuring device includes the actuator 1000, the suction nozzle 1102, the suction mechanism (not shown), a turntable 1110, a substrate 1120, and a measuring tool 1130.

The turntable 1110 is rotatably provided and has a plurality of storage grooves 1111 in which the electronic component 1080 is stored in the circumferential direction. The storage grooves 1111 are provided such that they penetrate through the turntable 1110. The electronic component 1080 is stored in the storage groove 1111 such that the electrode 1081 is on the lower surface side. The substrate 1120 supports the turntable 1110 such that it is rotatable and a surface thereof serves as a transport surface of the electronic component 1080. In addition, a through-hole 1121 is formed at the substrate 1120, the suction nozzle 1102 as a working element is provided at a position above the through-hole 1121, and the measuring tool 1130 is provided at a position below the through-hole 1121. The measuring tool 1130 is attached to a frame 1140, and a measurement terminal 1131 is provided on the upper surface of the measuring tool 1130 at a position corresponding to the electrode 1081 of the electronic component 1080.

Then, when a predetermined voltage or current is supplied to the first piezoelectric element 400a and the second piezoelectric element 400b while rotating the turntable 1110, and the suction nozzle 1102 as a working element is repeatedly displaced (moved up and down) at a high speed via the operating portion 500, the electronic components 1080 stored in the plurality of storage grooves 1111 are sequentially sucked and their electrical characteristics and the like are measured. That is, when the turntable 1110 is rotated and the electronic component 1080 stored in the storage groove 1111 is transported along the transport surface of the substrate 1120 and reaches a position corresponding to the through-hole 1121, the electronic component 1080 is sucked into the suction nozzle 1102, and in this state, the suction nozzle 1102 is displaced downward, the electrode 1081 of the electronic component 1080 is brought into contact with the electrode 1131 of the measuring tool 1130, and electrical characteristics of the electronic component 1080 are measured. After the measurement, the suction nozzle 1102 is displaced upward, the electronic component 1080 sucked into the suction nozzle 1102 is returned to the transport surface, and the suction is released. Then, when the next electronic component 1080 reaches a position corresponding to the through-hole 1121, the same operation is performed again, and these operations are repeated at a high speed.

In this case, since the working element is simply changed from the measuring probe 1101 to the suction nozzle 1102, the same effects obtained when the measuring probe 1101 is used can be obtained.

Figure 13:
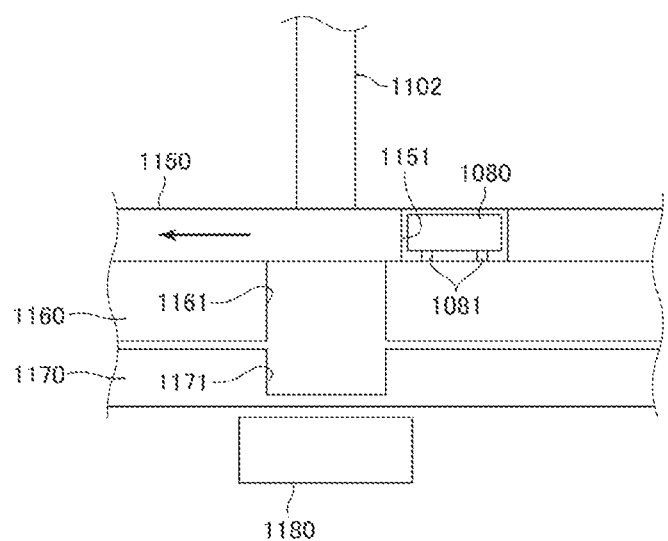
FIG. 13 is a diagram showing an example of an insertion device that inserts an electronic component using an actuator having a suction nozzle mounted thereon into a carrier tape.

In addition, the actuator 1000 in which the suction nozzle 1102 is mounted can be used for an insertion device that inserts an electronic component into a carrier tape. An example of the insertion device in this case is shown in FIG. 13. The insertion device includes the actuator 1000, the suction nozzle 1102, the above suction mechanism (not shown), a turntable 1150, a substrate 1160, and a magnet 1180.

The turntable 1150 is rotatably provided and has a plurality of storage grooves 1151 in which the electronic component 1080 is stored in the circumferential direction. The storage grooves 1151 are provided such that they penetrate through the turntable 1150. The substrate 1160 supports the turntable 1150 such that it is rotatable and a surface thereof serves as a transport surface of the electronic component 1080. In addition, a carrier tape 1170 is movably disposed below the substrate 1160. In the carrier tape 1170, a plurality of cavities 1171 in which the electronic component 1080 is stored are provided at equal intervals. A through-hole 1161 is formed at the substrate 1160, the suction nozzle 1102 as a working element is provided at a position above the through-hole 1161, and the magnet 1180 is provided at a position corresponding to the through-hole 1161 below the carrier tape 1170.

Then, while rotating the turntable 1150 and moving the carrier tape 1170, when a voltage or a current is supplied to the first piezoelectric element 400a and the second piezoelectric element 400b and the suction nozzle 1102 as a working element is repeatedly displaced (moved up and down) at a high speed, the electronic components 1080 stored in the plurality of storage grooves 1151 are sequentially inserted into the cavity 1171 of the carrier tape 1170. That is, when the turntable 1150 is rotated and the electronic component 1080 stored in the storage groove 1151 is transported along the transport surface of the substrate 1160 and reaches a position corresponding to the through-hole 1161, the electronic component 1080 is sucked into the suction nozzle 1102 and the cavity 1171 is positioned at a position corresponding to the through-hole 1161, and in this state, the suction nozzle 1102 is displaced downward, the suction of the suction nozzle 1102 is released, and the electronic component 1080 is inserted into the cavity 1171. After the insertion, the suction nozzle 1102 is displaced upward and returns to the position in FIG. 13 via the through-hole 1161 and the storage groove 1151. Then, when the next electronic component 1080 reaches a position corresponding to the through-hole 1161, the same operation is performed again, and these operations are repeated at a high speed. Here, the magnet 1180 is used to draw the electronic component 1080 in the cavity 1171 and stabilize the orientation of the electronic component 1080.

When the suction nozzle 1102 is used for the insertion device as described above, the same effects obtained when the measuring probe 1101 is used can also be obtained.

<Dispenser>

Next, a dispenser using the actuator of the above embodiment will be described.

Figure 14:
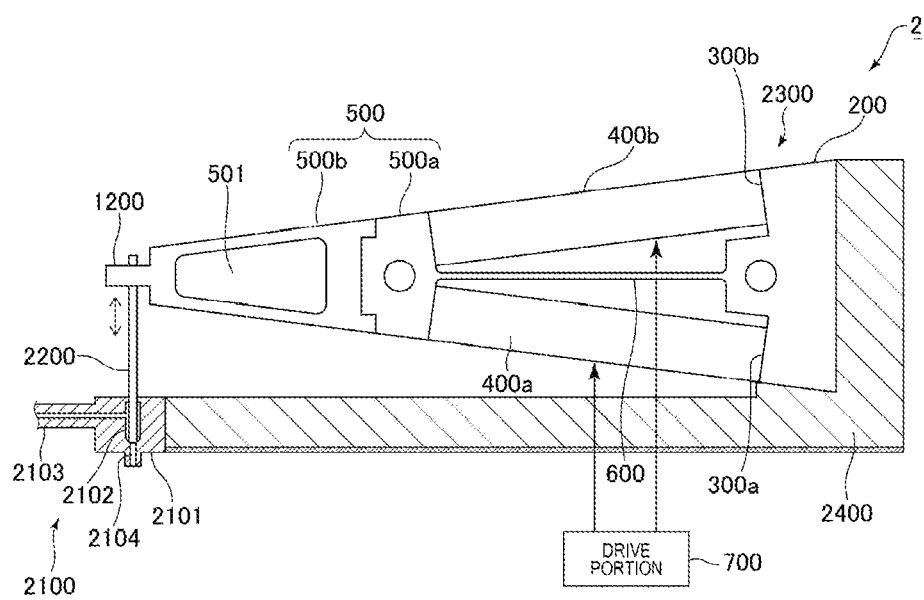
FIG. 14 is a partial cross-sectional front view showing a dispenser according to one embodiment.
Figure 15:
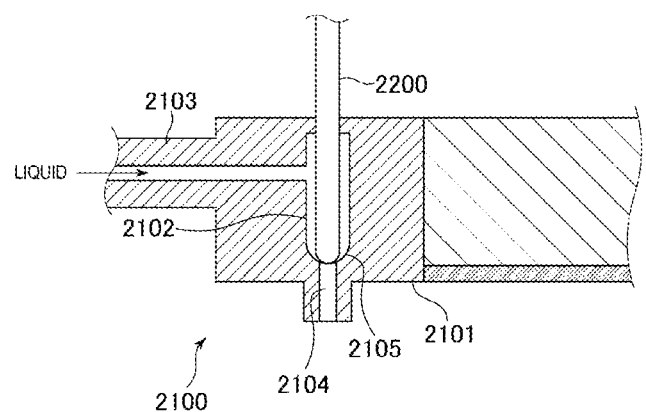
FIG. 15 is a cross-sectional view showing a liquid discharging member of the dispenser in FIG. 14.
Figure 16:
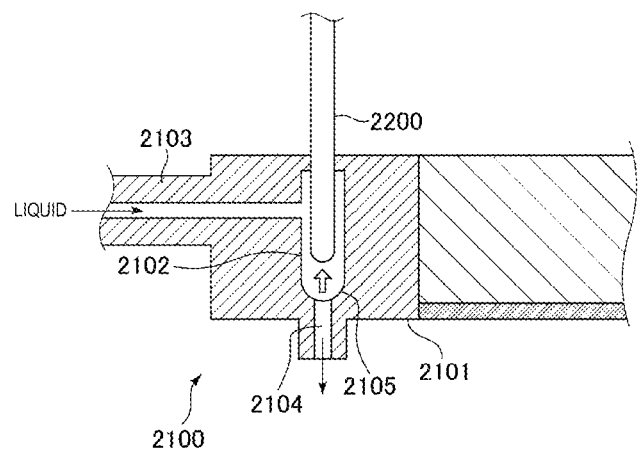
FIG. 16 is a cross-sectional view showing the liquid discharging member of the dispenser in FIG. 14.

FIG. 14 is a partial cross-sectional front view showing a dispenser according to one embodiment, and FIG. 15 and FIG. 16 are cross-sectional views showing a liquid discharging member.

As shown in FIG. 14, a dispenser 2000 includes a liquid discharging member 2100 into which a liquid is introduced and from which the introduced liquid is discharged, a valve 2200 for discharging a liquid from the liquid discharging member 2100 and performing blocking, and an actuator 2300 that drives the valve 2200.

As shown in FIG. 15, the liquid discharging member 2100 includes a main body portion 2101, a liquid chamber 2102 into which the valve 2200 formed in the main body portion 2101 is inserted, a liquid introducing portion 2103 that introduces a liquid into the liquid chamber 2102, a liquid discharge port 2104 that communicates with the bottom of the liquid chamber 2102, and a valve seat 2105 which is provided at the bottom of the liquid chamber 2102 and on which the tip of the valve 2200 is seated.

The valve 2200 has a tip having a spherical rod shape and extends in the Y direction in FIG. 15 which is the vertical direction, and the liquid chamber 2102 has a cylindrical shape corresponding to the shape of the valve 2200. As shown in FIG. 15, generally, the tip of the valve 2200 is seated on the valve seat 2105 and the liquid discharge port 2104 is blocked. In this state, no liquid is discharged.

The valve 2200 is driven to move up and down in the Y direction by the actuator 2300. In the state in FIG. 15, when the actuator 2300 is driven to move up the valve 2200, as shown in FIG. 16, the liquid discharge port 2104 is opened and a liquid is discharged from the liquid discharge port 2104.

Like the actuator 1000 in FIG. 8, the actuator 2300 includes the base portion 200 as a substrate, the first attachment portion 300*a* and the second attachment portion 300*b* which are provided on the surface on one side of the base portion, the first piezoelectric element 400*a* and the second piezoelectric element 400*b* of which one ends are connected to the first attachment portion 300*a* and the second attachment portion 300*b*, the operating portion 500 which is connected to the other ends of the first piezoelectric element 400*a* and the second piezoelectric element 400*b* and generates a displacement due to expansion and contraction of the piezoelectric element, the link portion 600 which is disposed substantially at the center between the first piezoelectric element 400*a* and the second piezoelectric element 400*b*, links the operating portion 500 and the base portion 200, and is made of a material having a higher Young's modulus than that of the first piezoelectric element 400*a* and the second piezoelectric element 400*b*, and a drive portion 700 which supplies a voltage or a current to the first piezoelectric element 400*a* and the second piezoelectric element 400*b* and drives the first piezoelectric element 400*a* and the second piezoelectric element 400*b* to expand and contract. The first piezoelectric element 400*a* and the second piezoelectric element 400*b* are obliquely disposed as in the actuator in FIG. 8. Then, when a voltage or a current is supplied to the first piezoelectric element 400*a* and the second piezoelectric element 400*b* by the drive portion 700, the first piezoelectric element 400*a* and the second piezoelectric element 400*b* are displaced by expansion and contraction, and thus the magnified displacement is output from the operating portion 500. Here, in this example, the first attachment portion 300*a* and the second attachment portion 300*b* are provided on the surface of the base portion 200.

The operating portion 500 includes the first operating portion 500*a* to which the piezoelectric element 400 is connected and the second operating portion 500*b* connected to the first operating portion 500*a*. A valve attachment portion 1200 for attaching to the valve 2200 is provided at the tip of the second operating portion 500*b*. In order to reduce the weight, the second operating portion 500*b* is made of a high-tensile aluminum material, and as shown in the drawing, may be processed so that the center portion becomes a thin part 501.

In this case, when a voltage is applied to the first piezoelectric element 400*a* to cause extension by the drive portion 700, the operating portion 500 is driven upward and accordingly, the valve 2200 can be raised. In addition, when a voltage is applied to the second piezoelectric element 400*b* to cause extension, the valve 2200 can be lowered. In addition, when one of the first piezoelectric element 400*a* and the second piezoelectric element 400*b* is caused to generate an expansion displacement and the other thereof is caused to generate a contraction displacement, the valve 2200 may be moved up and down.

Here, the base portion 200 of the actuator 2300 is supported by a support member 2400. In addition, the support member 2400 also supports the liquid discharging member 2100.

In the dispenser 2000 configured in this manner, when a voltage is applied to only the second piezoelectric element 400*b*, as shown in FIG. 15, the valve 2200 is moved downward, the liquid discharge port 2104 is blocked, and thus no liquid can be discharged. In addition, when a voltage is applied to only the first piezoelectric element 400*a*, as shown in FIG. 16, the valve 2200 is moved upward, the liquid discharge port 2104 is opened, and thus a liquid can be discharged from the liquid discharge port 2104.

In addition, when no voltage is applied to the first piezoelectric element 400*a* and the second piezoelectric element 400*b*, as shown in FIG. 15, the liquid discharge port 2104 is blocked by the valve 2200, the first piezoelectric element 400*a* is caused to generate an expansion displacement, and the second piezoelectric element 400*b* is caused to generate a contraction displacement, and as shown in FIG. 16, the valve 2200 is moved upward, the liquid discharge port 2104 is opened and may be normally closed so that a liquid is discharged from the liquid discharge port 2104.

In addition, when no voltage is applied, the valve 2200 opens the liquid discharge port 2104, and when a voltage is applied and thus the first piezoelectric element 400*a* is caused to generate a contraction displacement and the second piezoelectric element 400*b* is caused to generate an expansion displacement, the valve 2200 may be lowered and normally opened so that the liquid discharge port 2104 is blocked.

When one of the first piezoelectric element 400*a* and the second piezoelectric element 400*b* is caused to generate an expansion displacement and the other thereof is caused to generate a contraction displacement, the change in the length of the link portion 600 as described above is canceled out. Therefore, only the force related to bending deformation of the link portion 600 becomes a load on the displacement magnifying operation, and the influence on the displacement magnifying operation is reduced. In addition, when the temperature of the surroundings changes or when the piezoelectric element is driven at a high frequency and thus the temperature is raised due to self-heating from the piezoelectric element itself, even if the length of the piezoelectric element changes due to thermal expansion, the change is canceled out and liquid leakage can be prevented. In addition, as described above, since the creep influence of the piezoelectric element can be canceled out, liquid leakage can be almost completely reduced without performing the closed loop control that requires complicated control.

<Air Valve>

Next, an air valve using the actuator of the above embodiment will be described.

Figure 17:
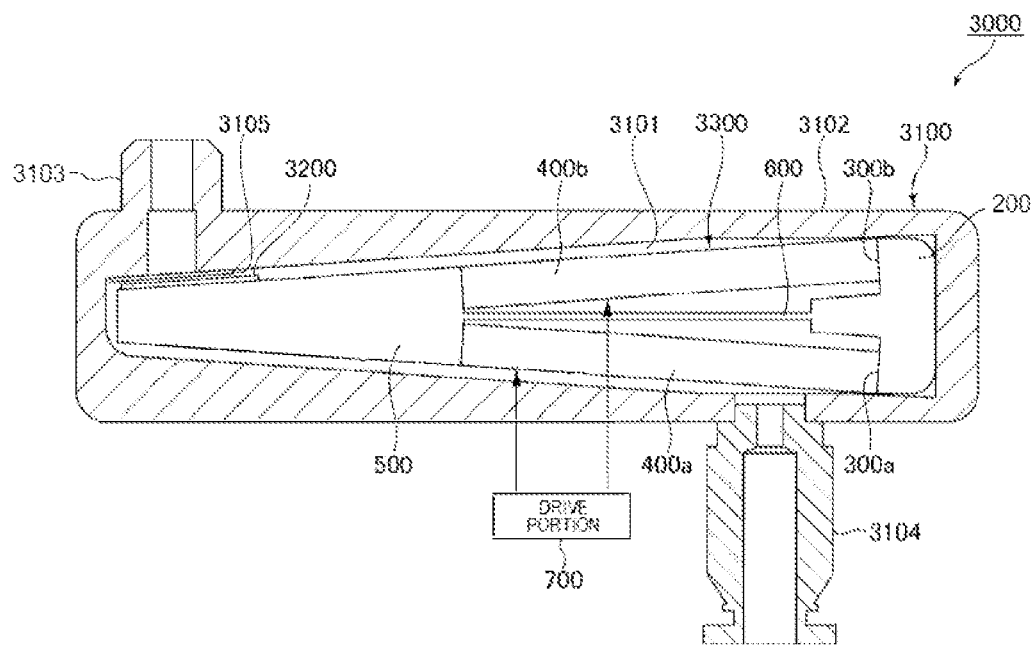
FIG. 17 is a cross-sectional view showing an air valve according to one embodiment.
Figure 18:
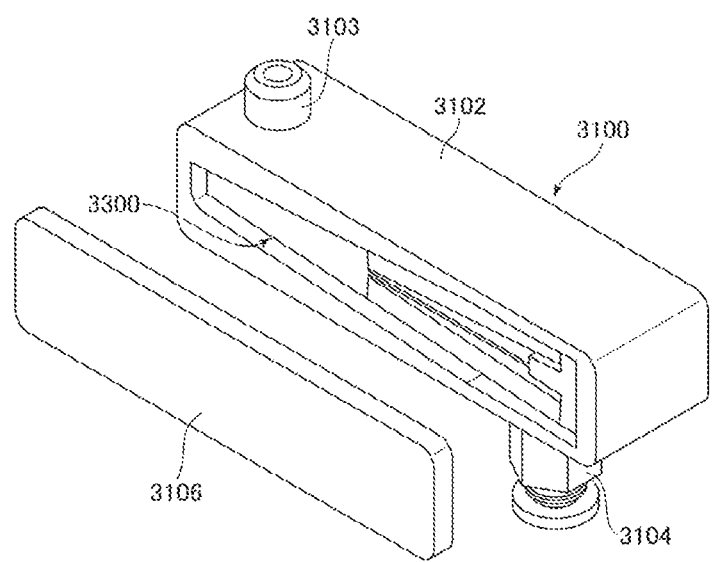
FIG. 18 is a perspective view showing an air valve according to one embodiment.

FIG. 17 is a cross-sectional view showing an air valve according to one embodiment, and FIG. 18 is a perspective view thereof.

As shown in the drawings, an air valve 3000 includes a valve main body 3100 including a housing 3102 that defines an compressed air chamber 3101 into which compressed air is introduced and an air outlet (nozzle) 3103 that opens to the outside from the compressed air chamber 3101, a valve body 3200 that operates to close or open the air outlet 3103, and an actuator 3300 that drives the valve body 3200.

An air supply port 3104 is formed at the compressed air chamber 3101, and compressed air is introduced from an air pressure supply source (not shown) via the air supply port 3104. The air outlet 3103 is provided at one portion of the wall part of the valve main body 3100 so that it comes out of the valve main body 3100 from the compressed air chamber 3101. In the portion in which the air outlet 3103 of the valve main body 3100 is provided, a valve seat 3105 is provided on the side of the compressed air chamber 3101. Here, 3106 indicates a lid of the housing 3102.

The valve body 3200 can be formed of, for example, a rubber sheet. The valve body 3200 comes in contact with and separates from the valve seat 3105, and when the valve body 3200 comes in contact with the valve seat 3105, a space therebetween is sealed. Here, the housing 3102 may have a function of a valve seat without providing the valve seat.

Like the actuator 1000 in FIG. 8, the actuator 3300 includes the base portion 200 as a substrate, the first attachment portion 300a and the second attachment portion 300b which are provided on the surface on one side of the base portion, the first piezoelectric element 400a and the second piezoelectric element 400b of which one ends are connected to the first attachment portion 300a and the second attachment portion 300b, the operating portion 500 which is connected to the other ends of the first piezoelectric element 400a and the second piezoelectric element 400b and generates a displacement due to expansion and contraction of the piezoelectric element, the link portion 600 which is disposed substantially at the center between the first piezoelectric element 400a and the second piezoelectric element 400b, links the operating portion 500 and the base portion 200, and is made of a material having a higher Young's modulus than that of the first piezoelectric element 400a and the second piezoelectric element 400b, and a drive portion 700 which supplies a voltage or a current to the first piezoelectric element 400a and the second piezoelectric element 400b and drives the first piezoelectric element 400a and the second piezoelectric element 400b to expand and contract. Then, the drive portion 700 supplies a voltage or a current to the first piezoelectric element 400a and the second piezoelectric element 400b and the first piezoelectric element 400a and the second piezoelectric element 400b are displaced by expansion and contraction, and thus the magnified displacement is output from the operating portion 500. Here, in this example, the first attachment portion 300a and the second attachment portion 300b are provided on the surface of the base portion 200. In addition, the operating portion 500 is not divided into the first operating portion 500a and the second operating portion 500b but is integrally formed.

In the example in FIGS. 17 and 18, the air supply port 3104 is provided at a position corresponding to the piezoelectric elements 400a and 400b. Therefore, an effect of cooling the piezoelectric elements 400a and 400b according to a flow of air supplied from the air supply port 3104 can be expected. In addition, when the air supply port 3104 is disposed so that it is aligned with the air outlet 3103, it is possible to minimize pressure loss from the air supply port 3104 to the air outlet 3103.

For the housing 3102 and the lid 3106, a resin material such as an aluminum die-cast or PPS can be applied. In the case of the aluminum die-cast, the housing 3102 and the lid 3106 can be bonded by air-tight screwing with an appropriate sealing material therebetween. In the case of the resin material, ultrasonic welding, laser welding, or the like can be applied.

In the air valve 3000 configured in this manner, when a voltage is applied to only the lower-side first piezoelectric element 400a, the valve body 3200 moves upward, the valve body 3200 comes in contact with the valve seat 3105, and no air is released from the air outlet 3103. When a voltage is applied to only the upper-side second piezoelectric element 400b, the valve body 3200 moves downward, and a gap is generated between the valve body 3200 and the valve seat 3105. Accordingly, compressed air supplied from the air supply port 3104 passes through a space on both sides of the actuator 3300, and is sprayed from the air outlet 3103 through the formed gap.

In addition, when no voltage is applied to the first piezoelectric element 400a and the second piezoelectric element 400b, if the air outlet 3103 is blocked by the valve body 3200, and the first piezoelectric element 400a is caused to generate a contraction displacement and the second piezoelectric element 400b is caused to generate an expansion displacement, the valve body 3200 moves downward, the air outlet 3103 is opened, and may be normally closed so that compressed air is sprayed from the air outlet 3103.

In addition, when no voltage is applied, the air outlet 3103 is opened, and when a voltage is applied and thus the first piezoelectric element 400a is caused to generate an expansion displacement and the second piezoelectric element 400b is caused to generate a contraction displacement, the valve body 3200 moves upward and may be normally open so that the air outlet 3103 is blocked.

When one of the first piezoelectric element 400a and the second piezoelectric element 400b is caused to generate an expansion displacement and the other thereof is caused to generate a contraction displacement, the same effects as in the dispenser can be obtained and air leakage and the like can be prevented.

<Other Applications>

While the embodiments of the present invention have been described above, the above embodiments are only examples and should not be considered as restrictive. The embodiments may be omitted, substituted, or modified in various forms without departing from the scope and spirit of the present invention.

For example, in the above embodiment, an example in which a displacement magnifying mechanism, a polishing device, and two piezoelectric elements as actuators are used has been exemplified, but three or more piezoelectric elements may be used. Therefore, it is possible to increase the degree of freedom of the operating portion in the displacement direction.

In addition, the displacement magnifying mechanism 100 according to one embodiment of the present invention may be used in a combined manner. In this case, it is possible to connect a plurality of displacement magnifying mechanisms in series, that is, it is possible to connect the base portion 200 of the displacement magnifying mechanism 100 and the operating portion 500 of another displacement magnifying mechanism 100, and thereby the displacement can be further increased. In particular, in places having severe space restrictions, such a usage manner is effective. In addition, a variation of a connection method such as connecting two displacement magnifying mechanisms 100 so that its connection angle is 90° is also conceivable.

In addition, while a case in which the piezoelectric element is used as the expansion and contraction element has been described in the above embodiment, any element that expands and contracts can be used without particular limitation. Other elements having an expansion and contraction function such as a magnetostrictive element and a shape-memory alloy can be used.

EXPLANATION OF REFERENCES

100 Displacement magnifying mechanism
200 Base portion
300 Attachment portion
400 Piezoelectric element
500 Operating portion
600 Link portion
700 Drive portion
800 Polishing portion
900 Polishing device
901 Polishing subject
902 Free abrasive grain
1000 Actuator
2000 Dispenser
3000 Air valve

What is claimed is:

1. A displacement magnifying mechanism, comprising:
a base portion serving as a substrate;
a first attachment portion and a second attachment portion which are provided on a surface on one side of the base portion;
a first piezoelectric element and a second piezoelectric element of which one ends are attached to the first attachment portion and the second attachment portion, respectively; and
an operating portion which is connected to the other ends of the first piezoelectric element and the second piezoelectric element and generates a displacement due to expansion and contraction of the piezoelectric elements; and
a link portion which is disposed between the first piezoelectric element and the second piezoelectric element, links the operating portion and the base portion, and applies pressure to the first piezoelectric element and the second piezoelectric element,
wherein the operating portion is disposed so that a distance from an upper portion of the base portion to the operating portion is longer than a distance between the first attachment portion and the second attachment portion,
wherein the first piezoelectric element is configured to generate an expansion displacement in case where the second piezoelectric element is configured to generate a contraction displacement, and
wherein the first piezoelectric element and the second piezoelectric element are configured to such that the extension line of axis in expansion and contraction directions of the first piezoelectric element intersects an extension line of axis in expansion and contraction directions of the second piezoelectric element on an extension line of axis of the link portion.

2. The displacement magnifying mechanism according to claim 1,
wherein the link portion is made of a metal and integrally processed with at least one of the base portion and the operating portion.

3. The displacement magnifying mechanism according to claim 1,
wherein a width of the attachment portion in contact with the base portion is formed to be narrower than a width thereof in contact with the piezoelectric element.

4. The displacement magnifying mechanism according to claim 1,
wherein an intermediate voltage of about ½ of the maximum application voltage is constantly applied to the first piezoelectric element and the second piezoelectric element, and
in a case where a voltage higher than the intermediate voltage is applied to the first piezoelectric element, a voltage lower than the intermediate voltage is applied to the second piezoelectric element.

5. A polishing device, comprising:
a displacement magnifying portion comprising
a base portion serving as a substrate;
a first attachment portion and a second attachment portion which are provided on a surface on one side of the base portion;
a first piezoelectric element and a second piezoelectric element of which one ends are connected to the first attachment portion and the second attachment portion respectively;
an operating portion which is connected to the other ends of the first piezoelectric element and the second piezoelectric element and generates a displacement due to expansion and contraction of the piezoelectric elements;
a link portion which is disposed between the first piezoelectric element and the second piezoelectric element, links the operating portion and the base portion, and applies pressure to the first piezoelectric element and the second piezoelectric element; and
a polishing portion which is provided on a surface of the operating portion opposite to a surface in contact with the first piezoelectric element and the second piezoelectric element,
wherein the operating portion is disposed so that a distance from an upper portion of the base portion to the operating portion is longer than a distance between the first attachment portion and the second attachment portion,
wherein the first piezoelectric element is configured to generate an expansion displacement in case where the second piezoelectric element is configured to generate a contraction displacement, and
wherein the first piezoelectric element and the second piezoelectric element are configured to such that the extension line of axis in expansion and contraction directions of the first piezoelectric element intersects an extension line of axis in expansion and contraction directions of the second piezoelectric element on an extension line of axis of the link portion.

6. An actuator, comprising:
a base portion serving as a substrate;
a first attachment portion and a second attachment portion which are attached to a surface on one side of the base portion;
a first piezoelectric element and a second piezoelectric element of which one ends are connected to tip portions of the first attachment portion and the second attachment portion, respectively;
an operating portion which is connected to the other ends of the first piezoelectric element and the second piezoelectric element and generates a displacement due to expansion and contraction of the piezoelectric elements;
a link portion which is disposed between the first piezoelectric element and the second piezoelectric element, links the operating portion and the base portion, and applies pressure to the first piezoelectric element and the second piezoelectric element; and a drive portion which supplies a voltage or a current to the first piezoelectric element and the second piezoelectric element and drives the first piezoelectric element and the second piezoelectric element to expand and contract, wherein the operating portion is disposed so that a distance from an upper portion of the base portion to the operating portion is longer than a distance between the first attachment portion and the second attachment portion, wherein the first piezoelectric element is configured to generate an expansion displacement in case where the second piezoelectric element is configured to generate a contraction, and wherein the first piezoelectric element and the second piezoelectric element are configured to such that the extension line of axis in expansion and contraction directions of the first piezoelectric element intersects an extension line of axis in expansion and contraction directions of the second piezoelectric element on an extension line of axis of the link portion.

7. The actuator according to claim 6, wherein the drive portion supplies a voltage or a current to the first piezoelectric element and the second piezoelectric element so that the first piezoelectric element and the second piezoelectric element are displaced in directions opposite to each other by a predetermined amount.

8. The actuator according to claim 7, wherein the operating portion is disposed so that a distance from the base portion is longer than a distance between the first attachment portion and the second attachment portion.

9. The actuator according to claim 7, wherein the first piezoelectric element and the second piezoelectric element are disposed to have a predetermined angle with respect to a direction perpendicular to a surface on which the base portion is installed.

10. The actuator according to claim 9, wherein the predetermined angle is provided so that extension lines of axes in expansion and contraction directions of the first piezoelectric element and the second piezoelectric element intersect on a line along which a load is applied to a displacement magnifying mechanism including the base portion, the first attachment portion and the second attachment portion, the first piezoelectric element and the second piezoelectric element, the operating portion, and the link portion.

11. The actuator according to claim 7, wherein the actuator drives a working element that is used for processing an electronic component in an electronic component processing device which processes a chip-like electronic component.

12. The actuator according to claim 11, wherein the electronic component processing device is a measuring device for measuring characteristics of an electronic component, and the working element is a measuring probe which is brought into contact with the electronic component and measures characteristics.

13. The actuator according to claim 11, wherein the electronic component processing device is a measuring device for measuring characteristics of an electronic component, and the working element is a suction nozzle for sucking the electronic component and the electronic component sucked into the suction nozzle is brought into contact with a measuring probe for measuring characteristics.

14. The actuator according to claim 11, wherein the electronic component processing device is an insertion device that inserts an electronic component into a carrier tape when the electronic component is taped, the working element is a suction nozzle for sucking the electronic component, and the electronic component sucked into the suction nozzle is inserted into the tape.

15. A dispenser, comprising:

a liquid discharging member into which a liquid is introduced and from which the introduced liquid is discharged;

a valve that allows discharge of a liquid from the liquid discharging member or blocks this; and the actuator according to claim 8 that drives the valve, wherein the valve is displaced due to the displacement output from the actuator and allows discharge of a liquid from the liquid discharging member and blocks this.

16. An air valve, comprising:

a valve main body including a compressed air chamber into which compressed air is introduced and an air outlet that opens to the outside from the compressed air chamber;

a valve body that operates to close and open the air outlet in the compressed air chamber; and the actuator according to claim 8 that is provided in the compressed air chamber and drives the valve body, wherein the valve body is displaced due to the displacement output from the actuator and allows discharge of air from the air outlet and blocks this.

17. The actuator according to claim 6, wherein an intermediate voltage of about ½ of the maximum application voltage is constantly applied to the first piezoelectric element and the second piezoelectric element, and in a case where a voltage higher than the intermediate voltage is applied to the first piezoelectric element, a voltage lower than the intermediate voltage is applied to the second piezoelectric element.

* * * * *